(12) United States Patent
Brahma et al.

(10) Patent No.: US 9,952,265 B2
(45) Date of Patent: Apr. 24, 2018

(54) METHOD FOR MEASURING DISPLAY BOND RESISTANCES

(71) Applicant: Apple Inc., Cupertino, CA (US)

(72) Inventors: Kingsuk Brahma, San Francisco, CA (US); David A. Stronks, San Jose, CA (US); Hopil Bae, Sunnyvale, CA (US); Wei H. Yao, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 236 days.

(21) Appl. No.: 14/993,711

(22) Filed: Jan. 12, 2016

(65) Prior Publication Data

US 2016/0202298 A1 Jul. 14, 2016

Related U.S. Application Data

(60) Provisional application No. 62/102,780, filed on Jan. 13, 2015.

(51) Int. Cl.
*G01R 27/20* (2006.01)
*G09G 3/20* (2006.01)
*G09G 3/36* (2006.01)
*G09G 3/00* (2006.01)

(52) U.S. Cl.
CPC ........... *G01R 27/205* (2013.01); *G09G 3/006* (2013.01); *G09G 3/2092* (2013.01); *G09G 3/2096* (2013.01); *G09G 3/3607* (2013.01); *G09G 3/3696* (2013.01); *G09G 2300/0426* (2013.01); *G09G 2310/08* (2013.01); *G09G 2320/0223* (2013.01)

(58) Field of Classification Search
CPC ......... G01R 27/205; G09G 2300/0426; G09G 2310/08; G09G 2320/0223; G09G 3/006; G09G 3/2092; G09G 3/2096; G09G 3/3607; G09G 3/3696
See application file for complete search history.

(56) References Cited

U.S. PATENT DOCUMENTS

6,046,876 A * 4/2000 Osafune ................. G11B 5/012
  360/46
6,940,301 B2    9/2005 Chen
8,305,094 B2   11/2012 Chang
(Continued)

*Primary Examiner* — Dmitriy Bolton
(74) *Attorney, Agent, or Firm* — Treyz Law Group, P.C.; G. Victor Treyz; David K. Cole (57) ABSTRACT

A display may have a substrate layer to which a display driver integrated circuit and flexible printed circuit are bonded. The display driver integrated circuit may be provided with switches and control circuitry for controlling the operation of the switches during bond resistance measurements. Test equipment may apply currents to pads in the display driver integrated circuit through contacts in the flexible printed circuit while controlling the switching circuitry. Based on these measurements and the measurement of trace resistances in a dummy flexible printed circuit, the test equipment may determine bond resistances for bonds between the display driver integrated circuit and the display substrate and between the flexible printed circuit and the display substrate. Displays may have master and slave display driver integrated circuits that share coarse reference voltages produced by the master from raw power supply voltages.

19 Claims, 9 Drawing Sheets

(56) References Cited

U.S. PATENT DOCUMENTS

| | | | |
|---|---|---|---|
| 2007/0216846 A1* | 9/2007 | Tseng | G02F 1/13452 349/149 |
| 2010/0295567 A1* | 11/2010 | Chang | G01R 31/046 324/719 |
| 2012/0161660 A1* | 6/2012 | Joo | G09G 3/20 315/240 |
| 2012/0161805 A1* | 6/2012 | Jung | G09G 3/006 324/754.07 |
| 2013/0009905 A1* | 1/2013 | Castillo | G06F 3/044 345/174 |
| 2014/0029230 A1* | 1/2014 | Oh | H05K 1/14 361/803 |
| 2014/0117998 A1* | 5/2014 | Hwang | G09G 3/006 324/511 |
| 2014/0125645 A1 | 5/2014 | Ghaderi et al. | |
| 2014/0187088 A1* | 7/2014 | Kim | G02F 1/1309 439/620.01 |
| 2015/0022741 A1* | 1/2015 | Nii | G06F 3/0416 349/12 |
| 2015/0160276 A1* | 6/2015 | Moon | G09G 3/006 702/65 |
| 2015/0198641 A1* | 7/2015 | Moon | G02F 1/0121 324/537 |

* cited by examiner

METHOD FOR MEASURING DISPLAY BOND RESISTANCES

This application claims the benefit of provisional patent application No. 62/102,780, filed Jan. 13, 2015, which is hereby incorporated by reference herein in its entirety.

BACKGROUND

This relates generally to displays, and, more particularly, to displays in which components are bonded to each other using conductive connections and displays in which multiple display driver integrated circuits are used that share reference voltages.

Electronic devices often include displays. Display driver circuitry is used to display images on an array of pixels in the display. The display driver circuitry may include a driver integrated circuit and thin-film transistor circuitry.

Display driver integrated circuits may be mounted on glass display substrates using what is sometimes referred to as a "chip on glass" arrangement. Flexible printed circuits ("flex circuits") may be used to interconnect the display driver integrated circuits and other display circuitry to a printed circuit board in an electronic device. A flexible printed circuit may be attached to bond pads on a display substrate using anisotropic conductive adhesive bonds. This type of arrangement is sometimes referred to as a "flex on glass" arrangement.

It can be challenging to form satisfactory low-resistance bonds when bonding a display driver circuit to a display using a chip on glass arrangement and when bonding a flexible printed circuit to a display using a flex on glass arrangement. If care is not taken, the resistance associated with chip-on-glass and flex-on-glass bonds may be too high or may be unreliable.

Some displays use multiple display driver integrated circuits. If care is not taken, excess overhead may be required to coordinate the operation of the display driver integrated circuits. For example, additional integrated circuits may be required to ensure that gamma block analog-to-digital converter circuitry in one display driver integrated circuit is coordinated with gamma block analog-to-digital converter circuitry in another display driver integrated circuit on the same display.

It would therefore be desirable to be able to analyze display connections such as chip-on-glass bonds and flex-on-glass bonds to ensure that bonds are being formed satisfactorily and would be desirable to be able to provide improved display drive integrated circuit architectures.

SUMMARY

A display may have a substrate layer to which a display driver integrated circuit and flexible printed circuit are bonded. The display driver integrated circuit may be provided with switches and may be provided with control circuitry for controlling the operation of the switches during bond resistance measurements. During normal operation of the display, display driver circuits within the display driver integrated circuit supply data and control signals to pixel circuits and other circuits within the display. During testing, test equipment makes measurements on the display using the switches of the display driver integrated circuit.

With one suitable arrangement, the test equipment may apply currents to pads in the display driver integrated circuit through the flexible printed circuit while controlling the switching circuitry and making voltage measurements. Based on these measurements and the measurement of trace resistances in a dummy flexible printed circuit, the test equipment may measure bond resistances for bonds between the display driver integrated circuit and the display substrate and between the flexible printed circuit and the display substrate.

In a display with multiple display driver integrated circuits, each display driver integrated circuit may be provided with an analog-to-digital stage with a coarse resistor string, a stage with a gamma block resistor string, and a stage with an interpolation resistor string. One of the display driver integrated circuits may serve as a master and one or more of the remaining display driver integrated circuits may serve as slaves. The coarse resistor string in the master may be used to provide coarse voltage reference outputs that are shared among the gamma block resistor strings of the master and slave display driver integrated circuits.

DETAILED DESCRIPTION

Figure 1:
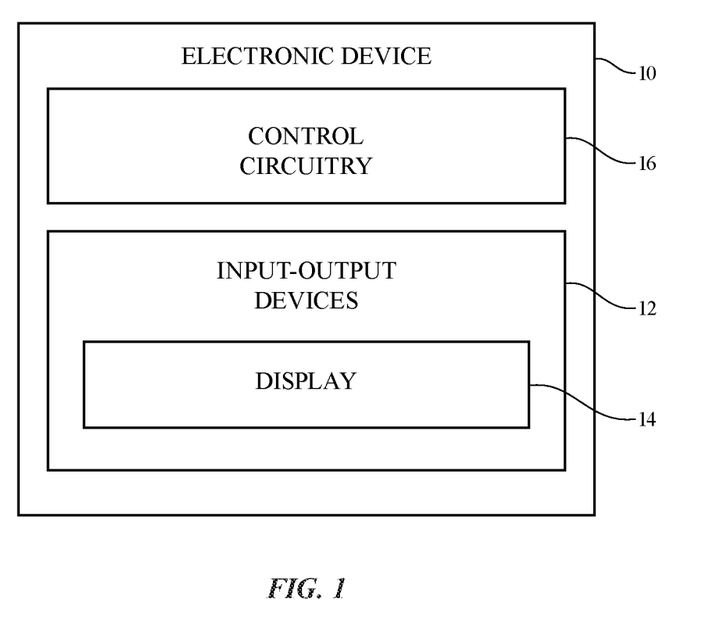
FIG. 1 is a diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Figure 2:
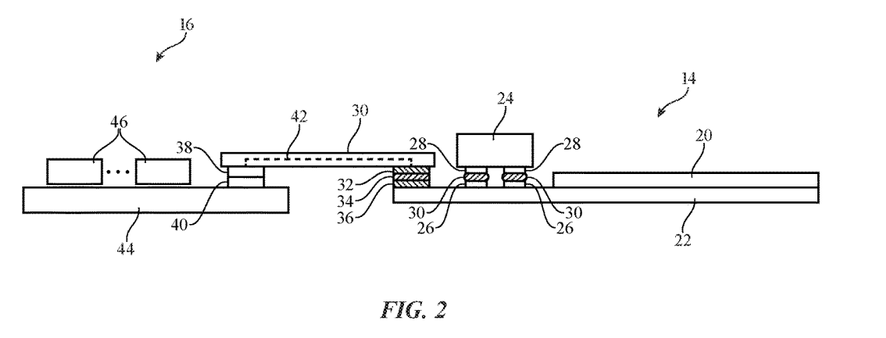
FIG. 2 is a diagram of an illustrative display coupled to control circuitry in an electronic device in accordance with an embodiment.

Display 14 may be an organic light-emitting diode display, a liquid crystal display, or a display based on other display technologies. A cross-sectional side view of display 14 is shown in FIG. 2. As shown in FIG. 2, display 14 may have a substrate layer such as substrate 22. Substrate 22 may be formed from glass, plastic, ceramic, or other materials. Display layers 20 may be formed on substrate 22. Display layers 20 preferably include structures for forming an array of pixels that display images for a viewer.

Display driver circuitry may be used to receive image data from control circuitry 16 and to provide corresponding data and control signals to the array of pixels in display 14. Display driver circuitry for display 14 may include thin-film transistors on substrate 22 and one or more integrated circuits such as illustrative display driver integrated circuit 24 of FIG. 2.

Display driver integrated circuit 24 may have contacts such as pads 28. Substrate 22 may have traces that are configured to distribute signals within display 14 and that are configured to form contacts such as pads 26. Conductive material 31 may be used to bond the pads on integrated circuit 24 such as pads 28 to the pads on display substrate 22 such as pads 26. Conductive material 31 may be solder, conductive adhesive, or other conductive material. There is a finite bond resistance associated with the bonds formed between pads 26 and 28. Satisfactory bonds have stable low resistances.

Control circuitry 16 may include one or more integrated circuits mounted on one or more printed circuits. In the example of FIG. 2, control circuitry 16 includes integrated circuits 46 that have been mounted on printed circuit board 44. A board-to-board connector or other suitable connection may be used to couple flexible printed circuit 30 to printed circuit board 44 and the circuitry of integrated circuits 46 (e.g., control circuitry 16 and other components in device 10). The board-to-board connector may include a first board-to-board connector such as connector 38 that is soldered to flexible printed circuit 30 and a second board-to-board connector such as connector 40 that is soldered to printed circuit board 44. Other types of connections between flexible printed circuit 30 and printed circuit board 44 may be used, if desired.

Flexible printed circuit 30 may include signal traces 42 that carry data signals, control signals, and power signals between printed circuit 44 and display 14. Traces 42 may be configured to form bond pads 32. Bond pads 32 may be bonded to mating bond pads 36 on substrate 22 using conductive material 34. Conductive material 34 may be conductive adhesive such as anisotropic conductive film (as an example). As with the bonds formed between pads 26 and 28, there is a finite resistance associated with each of the bonds formed between pads 32 and pads 36. This resistance should be low in magnitude and should be stable for satisfactory operation of device 10.

Configurations of the type in which display driver integrated circuits such as circuit 24 are bonded to substrate 22 and in which flexible printed circuit 30 is bonded to substrate 22 are sometimes referred to as chip-on-glass and flex-on-glass configurations, respectively. The quality of the chip-on-glass bonds and flex-on-glass bonds formed in connection with coupling printed circuit 44 to display 14 can affect device performance and reliability. Reliability can be enhanced by monitoring bond resistances for the chip-on-glass and flex-on-glass bonds during manufacturing. If bond resistances are too high or if there are unexpected changes in bond resistance during manufacturing operations, suitable corrective actions can be taken. Bond resistance measurements may therefore be used in monitoring manufacturing operations to ensure that bond formation processes are being performed satisfactorily.

Circuitry may be incorporated into display driver integrated circuit 24 to facilitate bond resistance measurements. The circuitry may include switches that are closed in various patterns to form signal paths during bond resistance measurements and that are opened during normal operation to avoid disruption the display driver circuitry of circuit 24.

With one suitable arrangement, bond resistance measurement circuitry may be used to facilitate the acquisition of bond resistance measurements through low-frequency control signal lines (e.g., signal lines that normally carry signals with frequencies in the range of 100 s of kHz (as an example). High-speed data lines (e.g., serial data paths that carry digital display data at speeds in excess of 1 Gbps) may be more sensitive than lower frequency control lines to the presence of switch parasitics and power lines are often coupled together in parallel, which can create challenges, but these types of signal lines may be used in making bond resistance measurements for display 14, if desired. The use of bond resistance measurement circuitry for making bond resistance measurements on signal lines that carry signals in the range of 100 s of kHz is sometimes described herein as an example. This is, however, merely illustrative. The bond resistance of any suitable signal paths between display 14 and printed circuit 44 may be measured, if desired.

Figure 3:
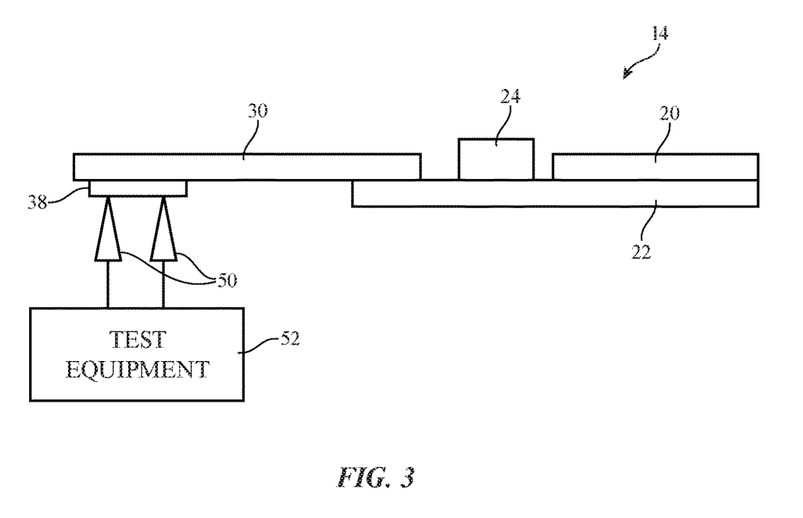
FIG. 3 is a cross-sectional side view of a display that is being tested using test equipment in accordance with an embodiment.

FIG. 3 is a diagram showing an illustrative test setup of the type that may be used during bond resistance measurements. As shown in FIG. 3, test equipment 52 may be coupled to flexible printed circuit. For example, probes 50 may be used to form electrical contact with desired contacts (pads) in board-to-board connector 38 (or pads that are formed directly on flexible printed circuit 30).

Test equipment 52 may include current source circuitry to apply known amounts of current to the contacts of flexible printed circuit 30. These currents flow through paths in circuit 30, the bonds between circuit 30 and substrate 22, the bonds between substrate 22 and display driver circuitry 24, and signal paths in circuitry 24. Test equipment 52 may include voltage measurement circuitry for monitoring resulting voltages on the contacts of flexible printed circuit 30.

During the application of current and measurement of the resulting voltages, bond resistance measurement circuitry within display driver integrated circuit 24 (e.g., switches that are controlled by test equipment 52) may be used to form signal paths that are appropriate for making desired bond resistance measurements. These switches can be placed in open states during normal operation of display 14 to ensure that display driver circuitry 24 can drive desired signals onto the pixel array of display 14 and thereby display images on display 14.

Test equipment 52 and the bond resistance measurement circuitry of integrated circuit 24 may be used during manufacturing to quantify bond quality for chip-on-glass and flex-on-glass bonds.

Figure 4:
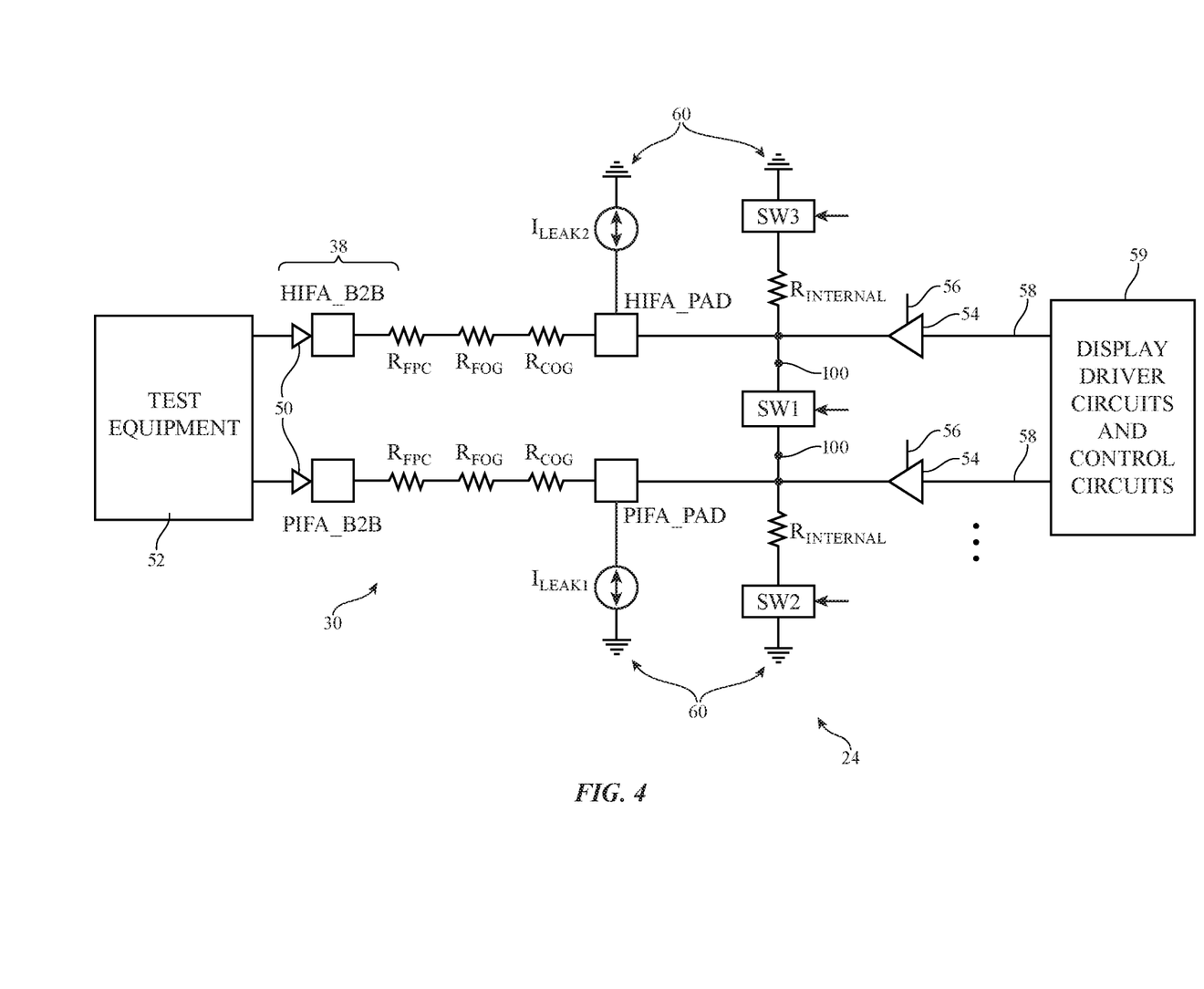
FIG. 4 is a circuit diagram of illustrative circuitry that may be used to facilitate bond resistance measurements in accordance with an embodiment.

FIG. 4 is a schematic diagram showing illustrative bond resistance measurement circuitry that may be used in display driver integrated circuit 24 to facilitate bond resistance measurements with test equipment 52. During normal operation of display 14, display driver circuitry 59 supplies output signals to the pixels and other circuits on display 14 (e.g. data signals, clock signals and other control signals, etc.). Signals may be routed to the circuitry of display 14 using pads such as pads HIFA_PAD and PIFA_PAD and other input-output pads on integrated circuit 24. The signals that are routed into and out of display driver circuitry 59 of integrated circuit 24 may be carried over signal lines such as signal lines 58.

As shown in FIG. 4, signal lines 58 may provide output signals (e.g., control signals for pads HIFA_PAD and PIFA_PAD) from display driver circuits 59 during normal operation of display driver integrated circuit 24. The output signals may be supplied to circuitry in display 14 using output buffers 54.

Output buffers 54 are preferably tristate buffers and can be controlled by control circuits in display driver circuits 59 of circuit 24 via control lines 56. During normal operation of display 14, buffers 54 may be enabled so that circuits 59 can supply signals from lines 58 to display 14. When it is desired to allow the outputs of buffers 54 to float during bond resistance measurements, test equipment 52 may direct display driver circuitry 24 (e.g., control circuitry in circuits 59) to tristate buffers 54 (i.e., to supply control signals to control inputs 56 of buffers 54 that place buffers 54 in a state in which the outputs of buffers 54 float). This allows internal signal pads HIFA_PAD and PIFA_PAD to float during bond resistance measurements. Circuits 59 may also be used in controlling the states of switches such as switches (transistors) SW1, SW2, and SW3 during normal operation and during bond pad measurements.

During bond resistance testing, test equipment 52 may direct display driver integrated circuit 24 to place switches such as switches SW1, SW2, and SW3 in appropriate on/off configurations to ensure that applied currents are routed through the chip-on-glass and flex-on-glass bonds of interest. The solder connections between display driver integrated circuit 24 and substrate 22 are associated with chip-on-glass bond resistances $R_{COG}$. The anisotropic conductive adhesive flex-on-glass bonds formed by attaching flexible printed circuit 30 to substrate 22 are associated with resistances $R_{FOG}$. The traces in flexible printed circuit 30 are associated with resistances $R_{FPC}$.

Test equipment 52 may use probes 50 to contact contacts in connector 38 such as pads PIFA_B2B and HIFA_B2B or other contacts (e.g., pins in board-to-board connector 38 or directly probed pads on flexible printed circuit 38).

As shown by the circuit diagram of FIG. 4, switches SW3 and SW2 may be grounded to ground terminals 60, switch SW1 may be coupled between pads HIFA_PAD and PIFA_PAD, pads HIFA_PAD and PIFA_PAD may exhibit leakage currents $I_{LEAK2}$ and $I_{LEAK1}$, and the signal paths in circuitry 24 have associated internal resistances of $R_{INTERNAL}$. If desired there may also be additional internal resistances between switch SW1 and nodes 100 (e.g., for current limiting). These additional internal resistances are not included in the example of FIG. 4.

Figure 5:
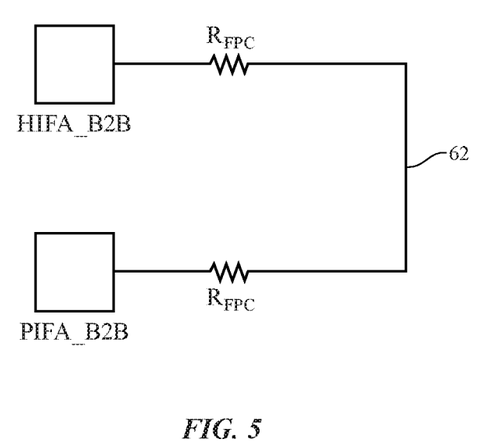
FIG. 5 is a circuit diagram of an illustrative dummy circuit that may be used in measuring the resistance associated with signal paths on a flexible printed circuit in accordance with an embodiment.

During testing, test equipment 52 may apply multiple known current values to a given one of pads PIFA_B2B and HIFA_B2B (e.g., pad PIFA_B2B) while measuring voltages on the pads. A dummy circuit on a flexible printed circuit of the same type used in forming flexible printed circuit 30 may be used to measure flexible printed circuit trace resistance $R_{FPC}$. An illustrative dummy circuit is shown in FIG. 5. In the dummy circuit, shorting path 62 is used to short together a pair of flexible printed circuit traces of resistance $R_{FPC}$ that are coupled to pads HIFA_B2B and PIFA_B2B. A known current may be applied to the circuit of FIG. 5 and the resulting voltage drop measured using a voltmeter in equipment 52. Trace resistance $R_{FPC}$ may then be determined using Ohm's law.

Network analysis and the measured value of $R_{FPC}$ from the dummy flexible printed circuit may be used to determine the combined value of $R_{COG}$ plus $R_{FOG}$, which is indicative of bond quality.

Figure 6:
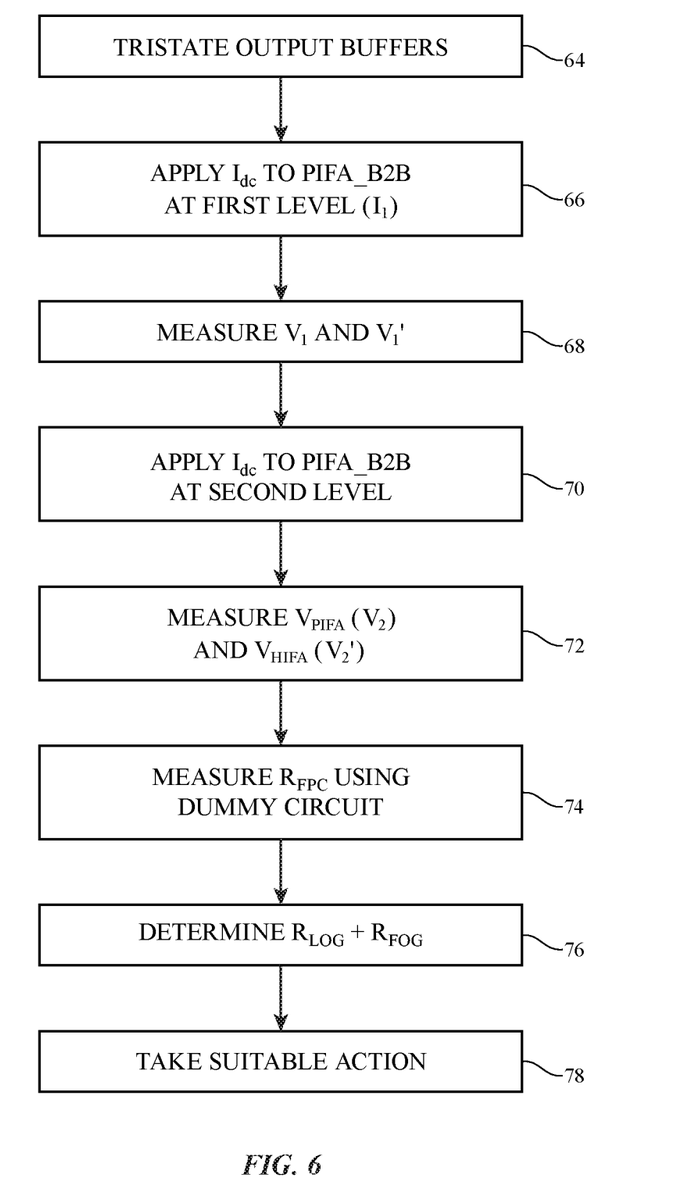
FIG. 6 is a flow chart of illustrative steps involved in making bond resistance measurements in accordance with an embodiment.

Illustrative operations involved in measuring $R_{COG}$+ $R_{FOG}$ are shown in FIG. 6.

At step 64, test equipment 52 may be used to tristate the output buffers coupled to pads HIFA_PAD and PIFA_PAD (i.e., tristate buffers 54 are tristated). This allows pads HIFA_PAD and PIFA_PAD to float during bond resistance measurements.

At step 66, an adjustable current source in test equipment 52 may be used to apply a current Idc to pad PIFA_B2B at a first known value $I_1$.

At step 68, test equipment 52 may measure the resulting voltage $V_1$ at PIFA_B2B and voltage $V_1'$ at HIFA_B2B.

At step 70, test equipment 52 may apply current Idc to pad PIFA_B2B at a second known value $I_2$.

At step 72, test equipment 52 may measure the resulting voltage $V_2$ at PIFA_B2B and voltage $V_2'$ at HIFA_B2B.

If desired, the operations of steps 66, 68, 70, and 72 may be repeated for the pad HIFA_B2B (i.e., currents may be applied to HIFA_B2B). When making measurements on PIFA_B2B, test equipment 52 directs circuits 59 (e.g., the control circuits of circuitry 59) to turn off switch SW3 and turn on switches SW1 and SW2. When making measurements on HIFA_B2B, test equipment 52 directs bond resistance measurement circuitry 24 to turn off switch SW2 and to turn on switches SW1 and SW3.

Control circuits in circuitry 59 turn off switches SW1, SW2, and SW3 during normal operation of display driver integrated circuit 24 and turn on buffers 54, so that circuitry 59 can supply signals for display 14 to pads HIFA_PAD and PIFA_PAD via buffers 54. Signal paths on display substrate 22 may be used to route signals from pads such as HIFA_PAD and PIFA_PAD and other display driver integrated circuit pads to the pixel array, gate driver circuitry, and other circuitry of display 14 during normal operation of display 14.

At step 74 of the testing operations of FIG. 6, the resistance of flexible printed circuit traces 42 ($R_{FPC}$) may be measured using the dummy circuit of FIG. 5. During measurement of $R_{FPC}$, test equipment 52 may apply a known current to pad PIFA_B2B of FIG. 5 and may measure the voltage drop across pads HIFA_B2B and PIFA_B2B. Using Ohm's law, the value of $R_{FPC}$ may then be determined.

The relationship between the resistances RFPC, RFOG, and RCOG, the ON resistances of the switches, and the currents and voltages that have been applied and measured during the operations of steps 66, 68, 70, 72, and 74 as determined by network analysis of the circuitry of FIG. 4 is given by the following equations:

$$V_1 = I_1*(R_{FPC}+R_{FOG}+R_{CoG})+(I_1-I_{leak1}-I_{leak2})*(R_{internal}+R_{ON\_SW2})$$

$$V_1' = (I_1-I_{leak1}-I_{leak2})*(R_{internal}+R_{ON\_SW2})-(I_{leak2})*(R_{ON\_SW1})$$

$$V_2 = I_2*(R_{FPC}+R_{FOG}+R_{CoG})+(I_2-I_{leak1}-I_{leak2})*(R_{internal}+R_{ON\_SW2})$$

$$V_2' = (I_2-I_{leak1}-I_{leak2})*(R_{internal}+R_{ON\_SW2})-(I_{leak2})*(R_{ON\_SW1})$$

$$V_1-V_2 = (I_1-I_2)*(R_{FPC}+R_{FOG}+R_{CoG})+(I_1-I_2)*(R_{internal}+R_{ON\_SW2})$$

$$V_1'-V_2' = (I_1-I_2)*(R_{internal}+R_{ON\_SW2})$$

$$(V_1-V_2)-(V_1'-V_2') = (I_1-I_2)*(R_{internal}+R_{ON\_SW2})$$

$$R_{FPC}+R_{FOG}+R_{CoG} = \frac{(V_1+V_2)-(V_1'-V_2')}{(I_1-I_2)}$$

Solving these equations for RFPC+RFOG+RCOG gives equation 1.

$$RFPC+RFOG+RCOG=[(V1-V2)-(V1'-V2')]/(I1-I2) \quad (1)$$

Subtracting the value of RFPC that was measured at step 74 from equation 1 results in the desired measured value of RFOG+RFCOG (step 76).

At step 78, actions may be taken based on this measured resistance value. If, for example, bond resistance is satisfactory (e.g., if measured bond resistance is below a predetermined threshold value and is stable when compared across samples), it can be concluded that the bonds for display 14 are being formed satisfactorily during manufacturing. If, however, bond resistance is high or is trending high after taking a number of samples on different displays, corrective action may be taken (e.g., bond formation parameters may be adjusted, bonds can be subjected to further inspection, etc.). Bond resistance measurements made during manufacturing may also be retained for use in future failure analysis operations after displays 14 have been used in the field.

If desired, control circuitry 16 may use circuitry of the type shown in FIG. 4 to make bond resistance measurements while device 10 is being used in the field. The use of test equipment 52 to make bond resistance measurements during manufacturing is merely illustrative.

Figure 7:
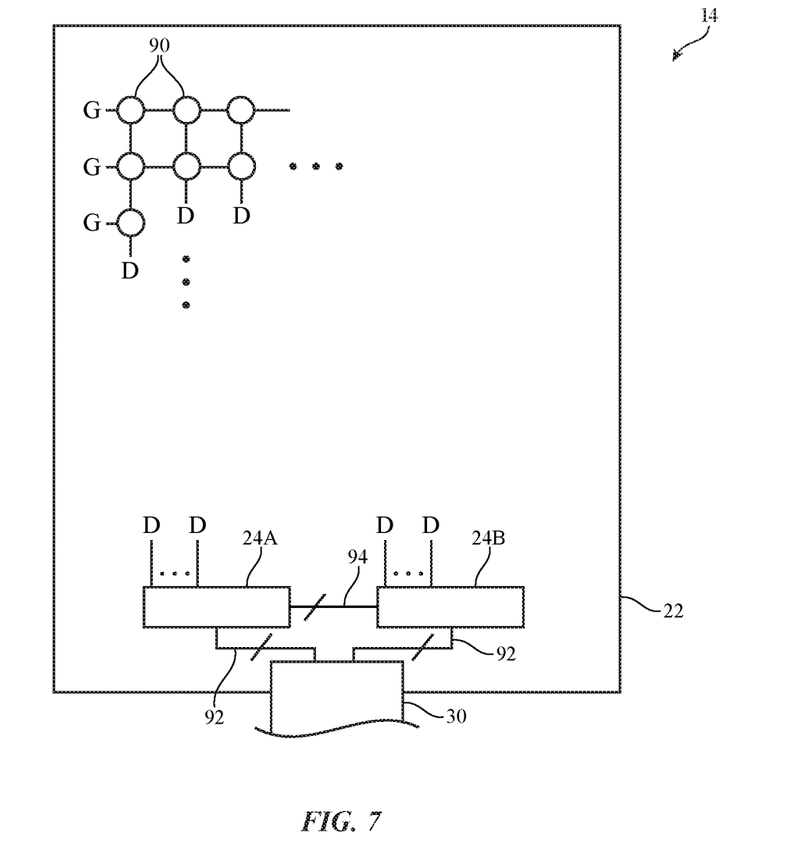
FIG. 7 is a diagram of an illustrative display with multiple display driver integrated circuits in accordance with an embodiment.

FIG. 7 is a diagram of an illustrative display with multiple display driver integrated circuits. Display 14 may contain an array of pixels 90 on substrate 22. Pixels 90 may be organic light-emitting diode pixels, liquid crystal display pixels, or other pixels. Data may be supplied to columns of pixels 90 via data lines D. Horizontal control signals (sometimes referred to as gate signals, scan signals, emission enable signals, etc.) may be distributed to pixels 90 via gate lines G (as an example).

Display driver integrated circuits 24A and 24B may be mounted on substrate 22. Display driver integrated circuits 24A and 24B (sometimes referred to as timing controller chips or TCON chips) may include gamma block circuitry for creating voltages that are used in converting digital image data into corresponding analog voltages to apply to data lines D, power management unit circuitry, source drivers for driving signals onto lines D, and other circuitry. Flexible printed circuit cable 30 may be used to supply image digital image data to integrated circuits 24A and 24B via paths 92. Paths 94 may carry reference voltages and may be used to coordinate operation between integrated circuits 24A and 24B. During operation, display driver integrated circuits 24A and 24B supply data line outputs D to the data lines in display 14. The input signals from paths 92 that control the data line output values are digital. The output signals on data line outputs D are analog signals that have been converted from the digital inputs on paths 92 using digital-to-analog converter circuitry. Circuits 24A and 24B may be used to drive signals onto respective halves of the data lines in display 14, thereby helping to reduce the amount of space consumed by signal line fan-out on display 14.

The digital-to-analog converter circuitry of display driver circuits 24A and 24B may contain resistor strings that serve as voltage dividers. The nodes between the resistors in the resistor strings have different voltages. Multiplexing circuitry may receive digital inputs and may route signals from particular nodes in the resistor strings to outputs in response to the digital inputs.

Display driver integrated circuits 24A and 24B may be formed using similar (identical) integrated circuits and may be mounted on substrate 22. Integrated circuit 24A may be configured to serve as a master and integrated circuit 24B may be configured to serve as a slave. There may be any suitable number of slave circuits in display 14 if desired. The use of two display driver integrated circuits (master and slave) in the example of FIG. 7 is illustrative.

The circuitry of display driver integrated circuits 24A and 24B may have a three-stage digital-to-analog converter architecture.

A first digital-to-analog converter stage (sometimes referred to as a coarse stage) may be used in producing a number of coarse reference voltages from raw power supply voltages (e.g., positive, negative, and ground power supply voltages). The coarse stage may be active in the master and inactive (deactivated) in the slave(s). The coarse reference voltages from the coarse stage in the master may be shared with the slave, so that the master and slave produce identical outputs for a given digital input, regardless of manufacturing variations that may arise when forming the master and slave.

A second digital-to-analog converter stage (sometimes referred to as the gamma block stage) is used in converting the coarse reference voltages into a series of gamma tap point voltages.

The third digital-to-analog converter stage (sometimes referred to as the interpolation stage or output stage) receives digital image data as inputs (e.g., gray levels from 0-255) and produces corresponding analog data signals on data lines D in the array of pixels 90. The relationship between the digital inputs to the interpolation stage and the magnitude of the voltages of the corresponding data signals D (sometimes referred to as the shape of the gamma curve of the display) is determined by the values of the gamma tap point voltages. By adjusting digital inputs to the gamma block stage, the shape of the gamma curve can be adjusted (e.g., using calibration settings supplied during manufacturing and testing operations).

Figure 8:
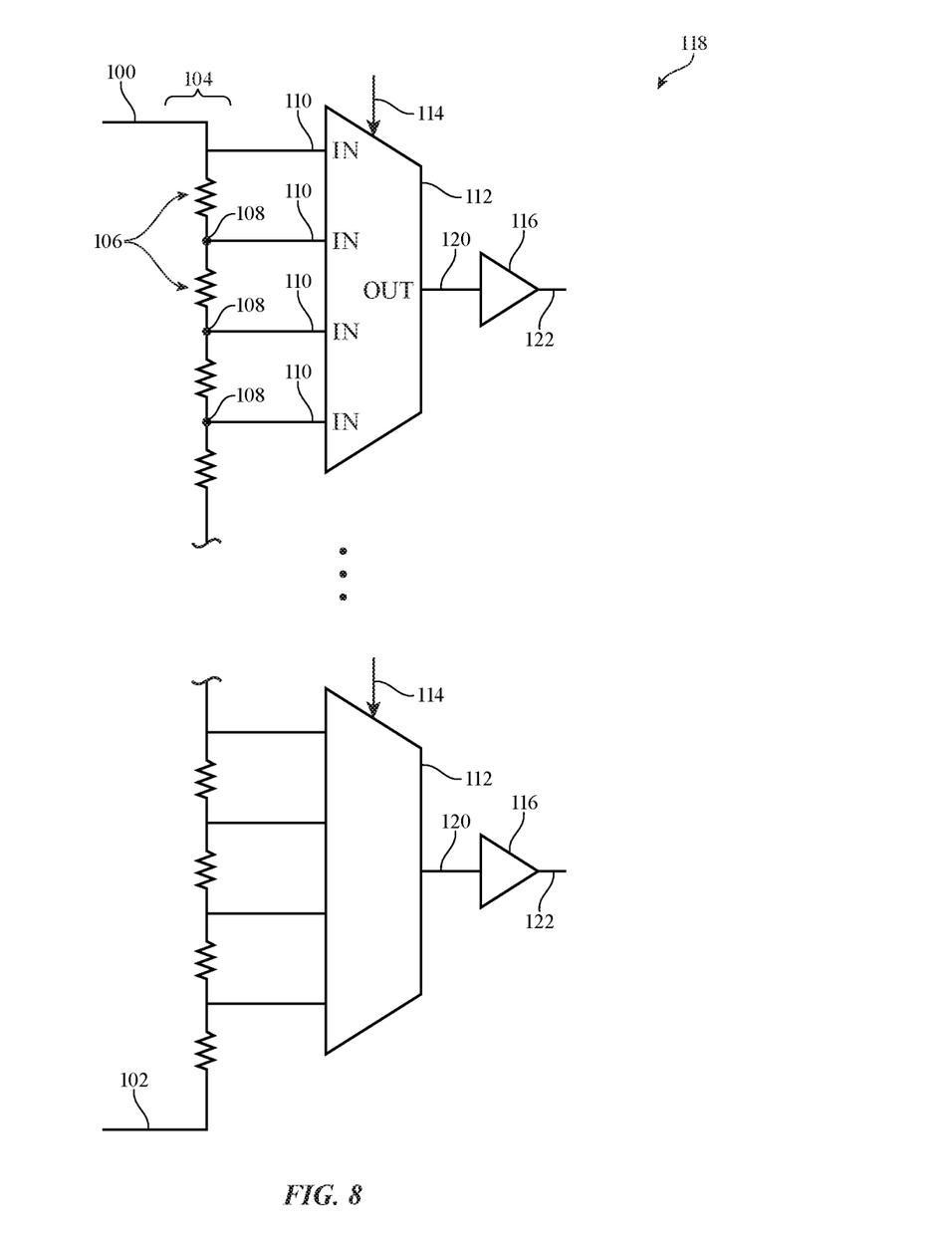
FIG. 8 is a diagram of an illustrative digital-to-analog converter circuit based on a resistor string and multiplexer circuitry in accordance with an embodiment.

FIG. 8 is a diagram showing how a set of resistors may be linked in series to form a resistor string for analog-to-digital converter circuitry of the type used by the stages in display drive integrated circuits 24A and 24B. As shown in FIG. 8, analog-to-digital converter circuitry 118 includes resistor string 104. Resistor string 104 contains multiple resistors 106 connected in series between voltage input terminals 100 and 102. In liquid crystal displays, both positive and negative drive voltages are used. Configurations in which terminal 100 is a positive power supply voltage terminal and terminal 102 is a ground power supply voltage terminal are sometimes described herein as an example.

Resistors 106 have relatively high values, so that minimal current flows between terminal 100 and terminal 102. String 104 serves as a voltage divider. Each node 108 between a respective pair of resistors 106 will have a different voltage level.

Multiplexer circuitry such as multiplexers 112 may be used to select from among the various available voltages on nodes 108. Multiplexer circuitry 112 may receive digital control signals at control inputs 114. Multiplexer circuitry 112 has multiple voltage inputs IN coupled to respective nodes 108 and has outputs OUT coupled to buffer amplifiers 116 by paths 120. In response to the digital input on each input 114, each multiplexer 112 may route a selected one of its inputs IN to its output OUT. Path 120 routes the selected output voltage to a corresponding buffer amplifier 116, which supplies a corresponding output on an output path 122. In the coarse stage, inputs 114 are used to produce a series of coarse reference voltages on a set of outputs 122 (e.g., a set of 3-10 outputs 122 or other suitable number of outputs 122). In the gamma block stage, the coarse reference voltages (which are shared between the master and slave) are applied to a distributed subset of nodes 108 to fix the values of those nodes at known reference voltages. This ensures that the gamma block stages in circuits 24A and 24B will operate identically. In the output stage, multiplexer circuitry receives digital image data values (0-255, for example) and produces corresponding analog data D on each data line (i.e., there is multiplexer circuitry associated with each data line that selects from among the nodes 108 in the interpolation resistor string in response to the digital data supplied to that multiplexer circuitry). The shape of the gamma curve for display 14 is established by controlling the values of the gamma tap point values from the gamma block stage. These values are supplied to a distributed subset of the resistor string nodes in the interpolation resistor string.

Figure 9:
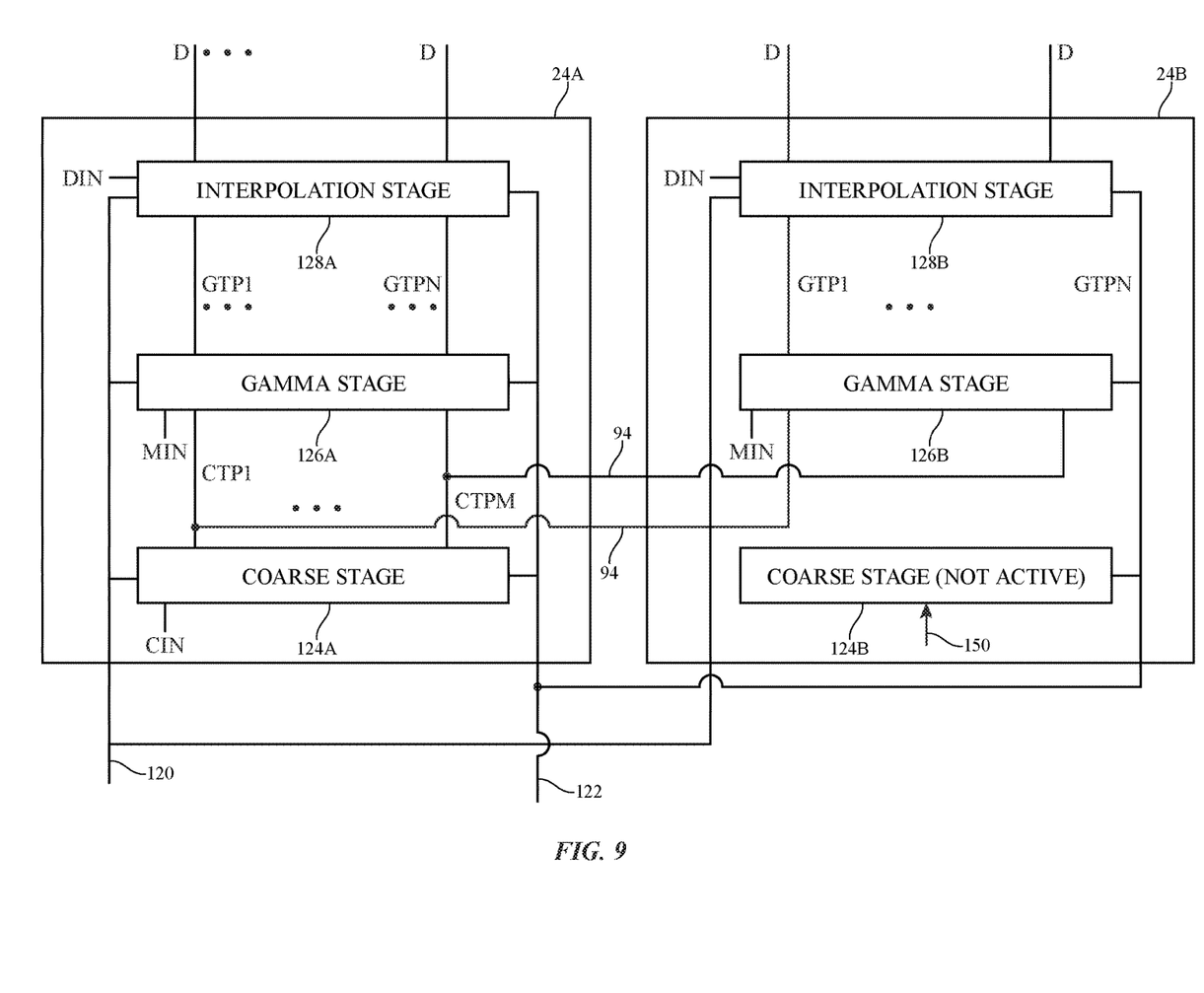
FIG. 9 is a diagram showing how two display driver integrated circuits may be operated together as master and slave in a display in accordance with an embodiment.

FIG. 9 is a schematic diagram showing how master 24A and slave 24B may be formed using identical integrated circuits. In master 24A, the coarse analog-to-digital converter circuitry (coarse string 124A) is active, whereas in slave 24B, the coarse analog-to-digital converter circuitry (coarse string 124B) has been disabled (e.g., turned off by application of a disable control signal to input 150) and is therefore not active.

Raw power supply voltages (e.g., +/−5V, ground) may be supplied to terminals 120 and 122 and distributed to the resistor stings in each analog-to-digital converter stage of both master 24A and slave 24B. Coarse analog-to-digital converter stage 124A receives control signals on digital input CIN that are used in determining the values of coarse reference voltages on coarse reference voltage outputs CTP1 . . . CTPM. Path 94 is used to route these coarse reference voltages from display driver integrated circuit 24A to display driver integrated circuit 24B (i.e., circuit 24A serves as master and circuit 24B serves as slave). Each coarse reference voltage is applied to an appropriate corresponding intermediate node among the resistor string in the appropriate gamma block stage.

Because the coarse reference voltages are shared between master and slave, gamma block stages 126A and 126B will operate identically (i.e., their operations are coordinated) in response to digital control signals on inputs MIN. In response to signals MIN, gamma block stage 126A produces corresponding gamma tap point voltages GTP1 . . . GTPN to interpolation stage 128A. In slave 24B, gamma block stage 126B produces corresponding gamma tap point voltages GTP1 . . . GTPN to interpolation stage 128B.

Because there are three or more coarse reference voltages provided to gamma stages 126A and 126B, gamma stages 126A and 126B are more accurately aligned with each other than they would be if these stages only shared raw power supply voltages. There may be any suitable number of coarse reference voltages (e.g., 3, 4, 5, 6, 7, more than 7, more than 10, less than 20, etc.). The use of more coarse reference voltages improves voltage alignment between stages 126A and 126B, but requires the use of additional signal lines in path 94. By using a relatively modest number of lines in path 94 (i.e., by connecting fewer than all of the nodes of the resistor strings of the master and slave gamma block stages), the amount of interconnect resources required on substrate 22 to align the master and slave gamma block stages may be minimized.

Interpolation stages 128A and 128B receive the gamma tap point voltages from the outputs of their respective gamma block stages and produce corresponding data signals on respective sets of data lines D in response to digital data signals on inputs DIN.

The foregoing is merely illustrative and various modifications can be made by those skilled in the art without departing from the scope and spirit of the described embodiments. The foregoing embodiments may be implemented individually or in any combination.

What is claimed is:

1. A display driver integrated circuit, comprising:
   display driver circuitry for supplying signals to a display, wherein the display driver circuitry includes control circuitry;
   a first tristate output buffer coupled to a first pad for supplying a first of the signals to the display;
   a second tristate output buffer coupled to a second pad for supplying a second of the signals to the display, wherein the first and second tristate buffers are controlled by the display driver circuitry; and
   a ground; and
   switching circuitry coupled between the first and second pads and the ground that is controlled by the control circuitry to make bond resistance measurements.

2. The display driver integrated circuit defined in claim 1 wherein the switching circuitry includes a first switch coupled between the first pad and the second pad.

3. The display driver integrated circuit defined in claim 2 wherein the switching circuitry includes a second switch coupled between the first pad and the ground.

4. The display driver integrated circuit defined in claim 3 wherein the switching circuitry includes a third switch coupled between the second pad and the ground.

5. The display driver integrated circuit defined in claim 4 wherein the first and second bond pads are bonded to the display and wherein the bond resistance measurements include measurements of resistances associated with bonds between the bond pads and the display.

6. The display driver integrated circuit defined in claim 5 wherein a flexible printed circuit is bonded to the display and wherein the bond resistance measurements include measurements of resistances associated with bonds between the flexible printed circuit and the display.

7. A method of measuring bond resistances for a display having a display substrate and a display driver integrated circuit, wherein the display driver integrated circuit has first and second pads attached with bonds to corresponding pads on the display substrate, wherein a flexible printed circuit has third and fourth pads attached with bonds to corresponding pads on the display substrate, wherein the flexible printed circuit has first and second contacts that are coupled respectively to the first and second pads on the display driver integrated circuit through traces in the flexible printed circuit and the third and fourth pads on the flexible printed circuit, and wherein measuring the bond resistances includes measuring bond resistances associated with the bonds for the first and second pads of the display driver integrated circuit and the bonds for the third and fourth pads of the flexible printed circuit, the method comprising:
- with test equipment, applying at least a first current to the first contact, wherein the first current flows through the flexible printed circuit, the third and fourth pads, the bonds with which the third and fourth pads of the flexible printed circuit are attached to the display substrate, and the bonds with which the first and second pads of the display driver integrate circuit are attached to the display substrate;
- while the first current is applied to the first contact, measuring a first voltage on the first contact with the test equipment;
- coupling the test equipment to a dummy flexible printed circuit; and
- measuring a trace resistance for a trace on the dummy flexible printed circuit with the test equipment while the test equipment is coupled to the dummy flexible printed circuit.

8. The method defined in claim 7 further comprising: measuring a second voltage on the second contact while the first current is applied to the first contact.

9. The method defined in claim 8 further comprising: applying a second current to the first contact.

10. The method defined in claim 9 further comprising: measuring a third voltage on the first contact while the second current is applied to the first contact.

11. The method defined in claim 10 further comprising: measuring a fourth voltage on the second contact while the second current is applied to the first contact.

12. The method defined in claim 11 further comprising: determining the bond resistances associated with the bonds for the first and second pads of the display driver integrated circuit and the bonds for the third and fourth pads of the flexible printed circuit based at least partly on the first and second currents and the first, second, third, and fourth voltages.

13. The method defined in claim 12 wherein determining the bond resistances associated with the bonds for the first and second pads of the display driver integrated circuit and the bonds for the third and fourth pads of the flexible printed circuit comprises determining the bond resistances associated with the bonds for the first and second pads of the display driver integrated circuit and the bonds for the third and fourth pads of the flexible printed circuit based at least partly on the measured trace resistance.

14. The method defined in claim 13 wherein a switch is coupled between the first and second pads, the method further comprising:
- closing the switch while applying the first current.

15. The method defined in claim 14 further comprising:
- opening the switch during normal operation of the display driver integrated circuit in which signals are supplied from the display driver integrated circuit to pixels in the display.

16. Apparatus, comprising:
- a display having a display substrate;
- a display driver integrated circuit that is coupled to the display substrate with first bonds and that has switches;
- a flexible printed circuit that has traces and that is coupled to the display substrate with second bonds; and
- test equipment that determines resistances for the first and second bonds by applying currents to the flexible printed circuit and measuring voltages while controlling the switches.

17. The apparatus defined in claim 16 wherein the first bonds comprise solder bonds.

18. The apparatus defined in claim 17 wherein the second bonds comprise conductive adhesive bonds.

19. The apparatus defined in claim 18 wherein the test equipment is configured to make flexible printed circuit trace resistance measurements on a dummy flexible printed circuit and wherein the test equipment is configured to determine the resistances for the first and second bonds at least partly based on the trace resistance measurements.

* * * * *